United States Patent
Tsyrganovich

(10) Patent No.: US 7,362,255 B1
(45) Date of Patent: Apr. 22, 2008

(54) CHOPPING AND OVERSAMPLING ADC HAVING REDUCED LOW FREQUENCY DRIFT

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 11/378,785

(22) Filed: Mar. 18, 2006

(51) Int. Cl.
*H03M 1/12* (2006.01)

(52) U.S. Cl. ..................... 341/172; 341/155

(58) Field of Classification Search ........ 341/130–150, 341/151–172, 173–175
See application file for complete search history.

(56) References Cited

U.S. PATENT DOCUMENTS

| | | | |
|---|---|---|---|
| 5,148,167 A * | 9/1992 | Ribner | 341/143 |
| 5,459,432 A * | 10/1995 | White et al. | 329/307 |
| 6,411,242 B1 * | 6/2002 | Oprescu et al. | 341/143 |
| 6,639,532 B1 * | 10/2003 | Liu et al. | 341/143 |

OTHER PUBLICATIONS

Y. -H. Chang et al., "Chopper-Stabilized Sigma-Delta Modulator", Proc. ISCAS, vol. 2, pp. 1286-1289 (May 1993).

K. Ishida et al., "Chopper-Stabilized High-Pass Sigma Delta Modulator Utilizing A Resonator Structure", IEEE Transactions On Circuits And Systems-II: Analog And Digital Signal Processing, vol. 50, No. 9, pp. 627-631 (Sep. 2003).

* cited by examiner

*Primary Examiner*—Lam T. Mai
(74) *Attorney, Agent, or Firm*—Imperium Patent Works; T. Lester Wallace

(57) ABSTRACT

An integrated circuit includes an analog-to-digital (ADC) portion and a processor portion. The processor portion generates high frequency noise. The ADC portion includes chopper switches, an ADC, a first low-pass filter (LPF), an inverter, and a second LPF. An analog sensor signal is chopped by the chopper switches at a chopping frequency below the processor noise frequency. The ADC performs conversions a rate higher than the chopper frequency such that multiple first conversions are performed when the chopper switches are in a first configuration and multiple second conversions are performed when the chopper switches are in a second configuration. The first LPF attenuates the high frequency noise, converts the first conversions into first information, and converts the second conversions into second information. The inverter inverts the second information. The second LPF attenuates transposed 1/F noise and converts the first information and the inverted second information into ADC output values.

19 Claims, 8 Drawing Sheets

CHOPPING AND OVERSAMPLING ADC

AMPLIFIER NOISE (PRIOR ART)

SAMPLE TIMES

RESULT OF CHOPPING (PRIOR ART)

RESULT OF INVERTING (PRIOR ART)

RESULT OF FILTERING (PRIOR ART)

ADC WITH EMBEDDED
MICROCONTROLLER

RESULT OF CHOPPING

RESULT OF INVERTING

RESULT OF LOW PASS FILTERING

CHOPPING AND OVERSAMPLING ADC

ADC EMBEDDED WITH PROCESSOR

FIRST LOW-PASS FILTERING

RESULT OF CHOPPING AND FIRST
LOW-PASS FILTERING

RESULT OF INVERTING

FREQUENCY RESPONSE OF
SECOND LOW-PASS FILTERING

RESULTS OF SECOND LOW-PASS FILTERING

US 7,362,255 B1

CHOPPING AND OVERSAMPLING ADC HAVING REDUCED LOW FREQUENCY DRIFT

TECHNICAL FIELD

The present invention relates to analog-to-digital converters (ADC), and more particularly relates to reducing low frequency noise in integrated ADC systems.

BACKGROUND

FIG. 1 (Prior Art) is a diagram showing noise in an analog system over a range of frequencies. At low frequencies there is significant noise and at high frequencies there is significant noise. The low frequency noise is sometimes referred to as "one over F" noise, denoted "1/F" noise. As can be seen from FIG. 1, there is an optimum operating frequency band where noise in the system is low. The system will typically be designed to operate in this low noise band.

FIG. 2 (Prior Art) is a diagram of an analog-to-digital (ADC) system. The system includes a sensor 1, a discrete amplifier 2, and a microcontroller integrated circuit 3. The microcontroller integrated circuit 3 includes an analog-to-digital converter (ADC) portion 4 and a digital processor portion 5. The digital processor portion 5 executes instructions stored in a memory. In this example, sensor 1 is a sensor whose output voltage changes slowly over about a three millivolt range. It is desired that the ADC system be able to detect small changes in the signal output by sensor 1. For example, the system is to output a different digital value that corresponds to each 0.003/128 volt change in the voltage signal output by sensor 1.

The ADC 4 of the microcontroller integrated circuit 3 may, for example, be an 11-bit ADC that has one millivolt/LSB sensitivity. One millivolt sensitivity means that the ADC can detect and output a different digital value when its input signal increased by one millivolt. Because the sensitivity of the ADC is one millivolt and because the system is to detect a 0.003/128 volt change in the sensor output voltage, the discrete amplifier in the exemplary system of FIG. 2 has a DC gain of about 43.

The ADC system is a low frequency system in that the sensor reading only needs to be generated a few times a second. The accuracy of each reading is, however, important. The peak-to-peak voltage range of the sensor signal voltage is 3 millivolts. The magnitude of the 1/F drift noise in the system at very low frequencies is approximately 0.5 millivolts. The signal-to-noise ratio at low frequencies is therefore 6. It is difficult to decipher the input signal from the low frequency noise. If, for example, the system is left running for twenty minutes, then the digital values output by ADC 4 will vary due to the 1/F noise. A technique known as chopping is often employed to help reduce the effects of low frequency noise. See, for example, the article entitled "Chopper-Stabilized Sigma-Delta Modulator", by Y.-H. Chang, et al., Proc. ISCAS, vol. 2, pages 1286-1289 (May 1993).

The system of FIG. 2 employs a chopping technique. Amplifier 2 is a commercially available discrete chopping amplifier integrated circuit. The chopping amplifier integrated circuit receives the voltage signal from sensor 1 via two terminals. On alternating cycles of a chopping clock signal generated within the chopping amplifier integrated circuit, each of the two terminals is coupled to a corresponding one of two input leads of a differential amplifier within the chopping amplifier integrated circuit. On the other cycles of the chopping clock signal, each of the two terminals is coupled to the other of the input leads of the differential amplifier. The coupling between the terminals and the input leads to the differential amplifier is therefore said to be "flipped" on alternating cycles of the chopping clock signal. The signal received from the sensor is said to be "chopped".

The signal output from the differential amplifier is passed through an inverter. The inverter is controlled to either invert the signal output by the differential amplifier, or to pass the signal output by the differential amplifier in noninverted fashion. On chopping clock signal cycles where the coupling between the input terminals and the input leads of the differential amplifier was flipped, the polarity of the signal output from the differential amplifier is inverted. The inverter is therefore controlled to invert during these chopping clock signal cycles. The output of the inverter is then passed through an analog low pass filter. The resulting output of the discrete chopping amplifier has reduced 1/F noise. Theoretically, the signal output from the discrete chopping amplifier 2 is essentially free of low frequency noise. The signal output from the chopping amplifier can be converted into a digital value by an ADC. It may, for example, be desired to use an ADC of a microcontroller integrated circuit for this purpose as is illustrated in FIG. 2.

FIG. 3 (Prior Art) illustrates a chopping technique in further detail. Sensor 1 is outputting a DC signal voltage represented by the horizontal line 10. The ADC ideally should output a stream of identical digital values corresponding to the DC magnitude of this DC signal. In the example, the physical quantity being detected by the sensor is not changing, so the DC signal output by the sensor is not changing over the twenty minute period illustrated in FIG. 3. In addition to the DC signal voltage of line 10, there is 1/F noise represented by waveform 11. In this example, the magnitude of this noise drifts up and down over the 20 minute time period. The upward pointing vertical arrows at the bottom of the diagram illustrate the times at which the ADC performs analog-to-digital conversions.

FIG. 4 (Prior Art) illustrates the effects of chopping (the flipping of the terminal/input lead coupling). During the first cycle of the chopping clock signal, the two terminals of the chopping amplifier are directly coupled to the corresponding input leads of the differential amplifier. The signal output by the differential amplifier is therefore not inverted. Horizontal line 12 indicates the value that ideally should be output from the differential amplifier. This value corresponds to the DC signal voltage output by the sensor. There is, however, an amount of 1/F noise introduced due to the circuitry of the discrete chopping amplifier and the ADC. This noise adds to the DC signal. Line 13 represents the actual value that is output from the differential amplifier.

During the second cycle of the chopping clock signal, the coupling between the two terminals and the two input leads of the differential amplifier is flipped. The signal output by the differential amplifier is therefore inverted. Line 14 represents the value that should be output from the differential amplifier. This value corresponds to the DC signal voltage output by the sensor, but the value is inverted due to the flipping. There is, however, an amount of 1/F noise. This 1/F noise is a characteristic of the circuitry of the discrete chopping amplifier and the ADC. The 1/F noise therefore is not inverted due to the flipping. This noise, which is not inverted, adds to the inverted DC signal voltage. Line 15 illustrates the actual value that is output from the differential amplifier.

FIG. 5 (Prior Art) illustrates a next step in the chopping technique. On cycles of the chopping clock signal when the terminal/input lead coupling is flipped, the signal output from the differential amplifier is inverted. On cycles of the chopping clock signal when the terminal/input lead coupling is not flipped, then the signal output from the differential amplifier is not inverted. The result of this inverting process is illustrated in FIG. 5 as a waveform involving a sequence of levels 16-26.

FIG. 6 (Prior Art) illustrates a next step in the chopping technique. The waveform of levels 16-26 of FIG. 5 is passed through a low pass filter. The output of the low pass filter is represented by dashed waveform 27. It is seen that the magnitude of drift noise about the expected signal value represented by horizontal line 10 is much less than the magnitude of 1/F noise represented by waveform 11.

FIGS. 7-10 (Prior Art) are diagrams that illustrate operation of the chopping process in the frequency domain. FIG. 7 (Prior Art) illustrates the 1/F noise 11 and the frequency spectrum 28 of the sensor input signal at the beginning of the chopping process. The 1/F noise is at the approximate frequency of the sensor signal to be detected.

FIG. 8 (Prior Art) shows the result of chopping at the chopping frequency. The chopping frequency may, for example, be one gigahertz. The spectrum 29 of the transposed input signal is centered at the chopping frequency. The 1/F noise, however, is not transposed.

FIG. 9 (Prior Art) illustrates the result of the inverting process. The input signal is transposed back down to zero frequency and is represented by spectrum line 28. The 1/F noise is, however, transposed up to the inverting frequency (the chopping frequency). This transposed noise is illustrated by dashed line 30.

FIG. 10 (Prior Art) illustrates the result of the low pass filtering. Line 31 illustrates the frequency response of the low pass filter. The low pass filter has removed the transposed low frequency noise of line 30 of FIG. 9. At zero frequency (DC), there is no 1/F noise. The result in this ideal example is the input signal. The spectrum of the input signal is represented by line 28.

The system of FIG. 2 involves a discrete chopping amplifier integrated circuit and a microcontroller integrated circuit. The discrete chopping amplifier is expensive, takes up printed circuit board space, and consumes power. A straightforward attempt to integrate the electronics of the chopping amplifier into the microcontroller integrated circuit, however, results in decreased performance. When the input terminals of the chopping amplifier are coupled to a DC voltage source, the actual ADC output values change as if the input to the ADC changed over about a 4.0 millivolt range, and if special shielding techniques are used the change is as if the input to the ADC changed over a 0.4 millivolt range. Where the system is to detect 23 microvolt steps in the signal output by sensor 1, performance of the integrated system is so bad (the signal-to-noise ratio is approximately ten) that it is difficult to detect the low amplitude sensor signal of FIG. 2 to the resolution required. This is a problem.

SUMMARY

An integrated circuit comprises a digital processor portion and an analog-to-digital converter portion. The analog-to-digital converter portion receives an analog input signal from a pair of input terminals of the integrated circuit and generates therefrom an ADC output value that is a digital representation of the magnitude of the analog input signal. The analog-to-digital converter portion comprises a chopping switch circuit, an analog-to-digital converter (ADC), a first low-pass filter/inverter, and a second low-pass filter.

The chopping switch circuit receives the analog input signal directly from the sensor via a pair of input terminals of the integrated circuit. The chopping switch circuit chops the analog input signal at a chopping frequency.

The ADC has a pair of input leads that are coupled to the chopping switch circuit. The ADC performs analog-to-digital conversions on the chopped output from the chopping switch circuit at a rate that is substantially higher than the chopping frequency. This is referred to here in this patent document as "oversampling". When the switches inside the chopping switch circuit are configured a first way, the ADC performs a first plurality of analog-to-digital conversions to generate a first plurality of conversion values. When the switches inside the chopping switch circuit are configured a second way (to invert polarity), the ADC performs a second plurality of analog-to-digital conversions to generate a second plurality of conversion values.

The first low-pass filter/inverter receives the first plurality of conversion values and generates therefrom a first low-pass filtered digital value. The first low-pass filter/inverter also receives the second plurality of conversion values and generates therefrom a second low-pass filtered digital value. The first low-pass filter/inverter includes a first low-pass filter that has a cutoff frequency that is higher than the chopping frequency but is lower than the frequency of high frequency noise generated by the digital processor portion. The first low-pass filter therefore attenuates or eliminates the high frequency noise.

In one example, the first low-pass filter/inverter generates the second low-pass filtered digital value by: low-pass filtering the second plurality of analog-to-digital conversions to generate a single low-pass conversion value, and then inverting the single low-pass conversion value to generate the second low-pass filtered digital value. In another example, the first low-pass filter/inverter generates the second low-pass filtered digital value by: inverting each of the second plurality of analog-to-digital conversions values, and then low-pass filtering the inverted values to generate the second low-pass filtered digital value.

The second low-pass filter receives both the first low-pass filtered digital value and the second low-pass filtered digital value. The second low-pass filter has a cutoff frequency that is lower than the chopping frequency. The second low-pass filter attenuates or eliminates low frequency noise (for example, 1/F noise) that was transposed to the chopping frequency as a result of the inverting performed by the first low-pass filter/inverter. The second low-pass filter uses the first and second low-pass filter digital values to generate the ADC output value.

Although in the example just described the first and second low-pass filters are low-pass digital filters that have down-sampled outputs, the first and/or second low-pass filters can be low-pass digital filters whose outputs are not down-sampled. For the down-sampled output example, there are multiple digital values supplied to the digital filter for each digital value output from the digital filter. For the non-down-sampled output example, there is one digital value supplied to the digital filter for each digital value output from the digital filter.

In one example, the integrated circuit is part of a sensor system that includes a sensor. The sensor is directly coupled to the pair of input terminals of the integrated circuit. There is no intervening amplifier in the signal path of the analog input signal between the sensor and integrated circuit. The expense and power consumption associated with providing an intervening amplifier are not incurred. The sensor system outputs a different 16-bit digital value for each 23 microvolt step in the analog signal output from the sensor, even when the analog-to-digital converter portion is integrated in a straightforward simple way onto the same integrated circuit along with the digital processor portion. The signal-to-noise ratio of the sensor system is greater than one hundred at DC (zero Hertz) when the integrated circuit is receiving and converting the analog signal from the sensor into 16-bit values.

Other embodiments and advantages and considerations are described in the detailed description below. For example, techniques are described in the detailed description for reducing power consumption. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 11:
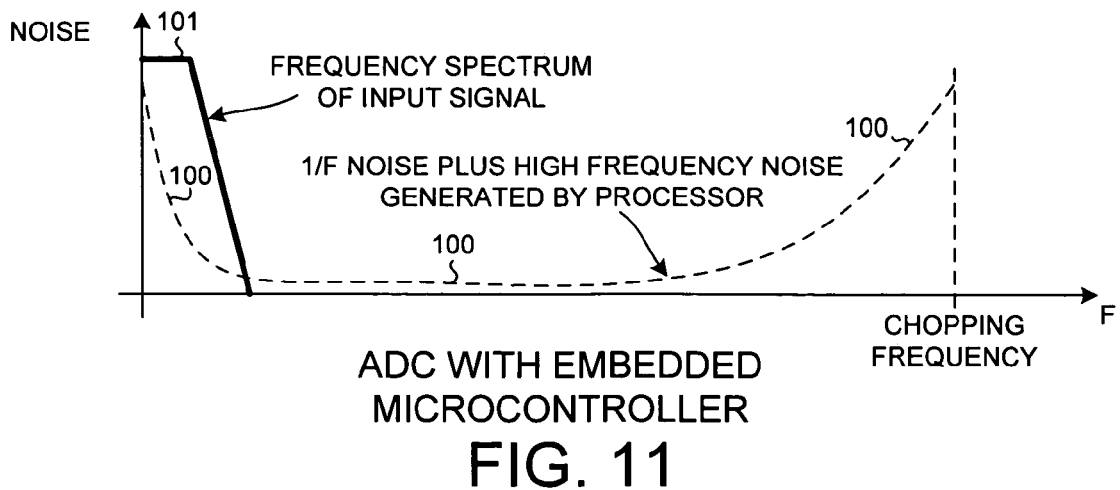
FIGS. 11-14 illustrate a problem that may be encountered if the chopping amplifier of FIG. 2 were to be integrated onto an integrated circuit along with a digital processor.

One reason that a simple integration of a conventional chopping amplifier circuit into a microcontroller integrated circuit might result in poor performance is explained in connection with FIGS. 11-14. The digital processor and other circuitry within the microcontroller integrated circuit generate high frequency noise. In the case of the digital processor, this noise may be generated by the rapid switching of transistors and many signal lines of various shapes and lengths as the processor fetches and executes instructions and reads from and writes to memory. Total system noise includes the low frequency 1/F noise as well as this high frequency noise. The dashed line 100 in FIG. 11 illustrates total system noise. The rise in dashed line 100 to the right of the diagram is due to high frequency noise generated by the digital processor portion of the microcontroller integrated circuit. The spectrum 101 of the signal to be detected is represented by line 101.

Figure 12:
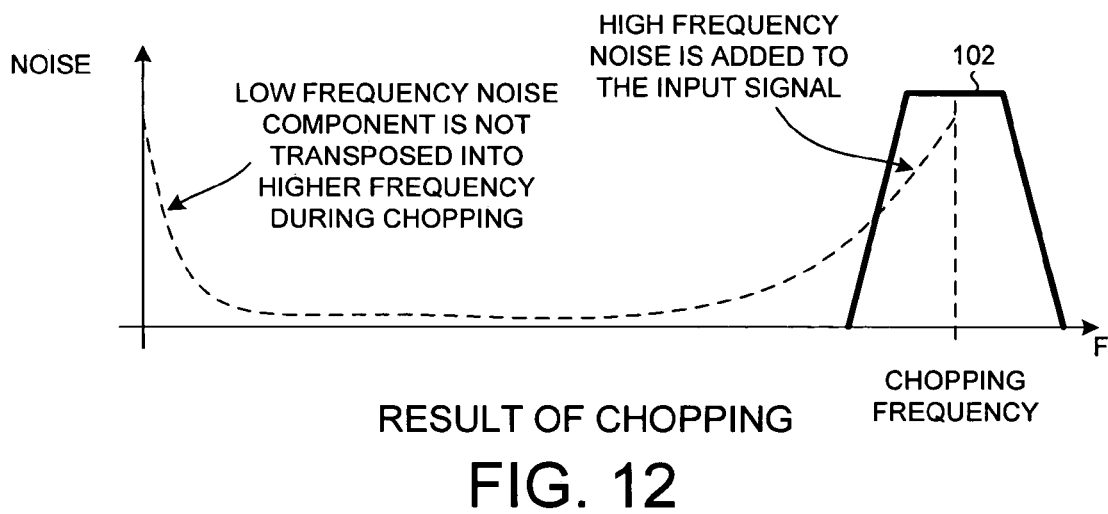

FIG. 12 illustrates the result of chopping. The spectrum of the sensor input signal is transposed so that it is centered at the chopping frequency as illustrated by line 102. The chopping frequency may, for example, be one hundred megahertz.

Figure 13:
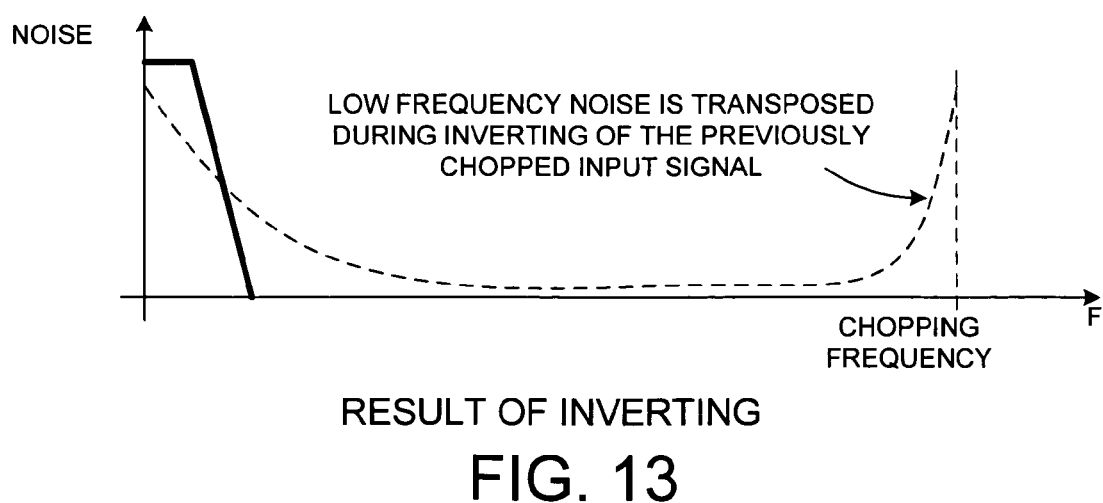

FIG. 13 illustrates the result of inverting. The low frequency 1/F noise is transposed up to the chopping frequency as desired in classical chopping, but the high frequency noise is transposed down to low frequencies.

Figure 14:
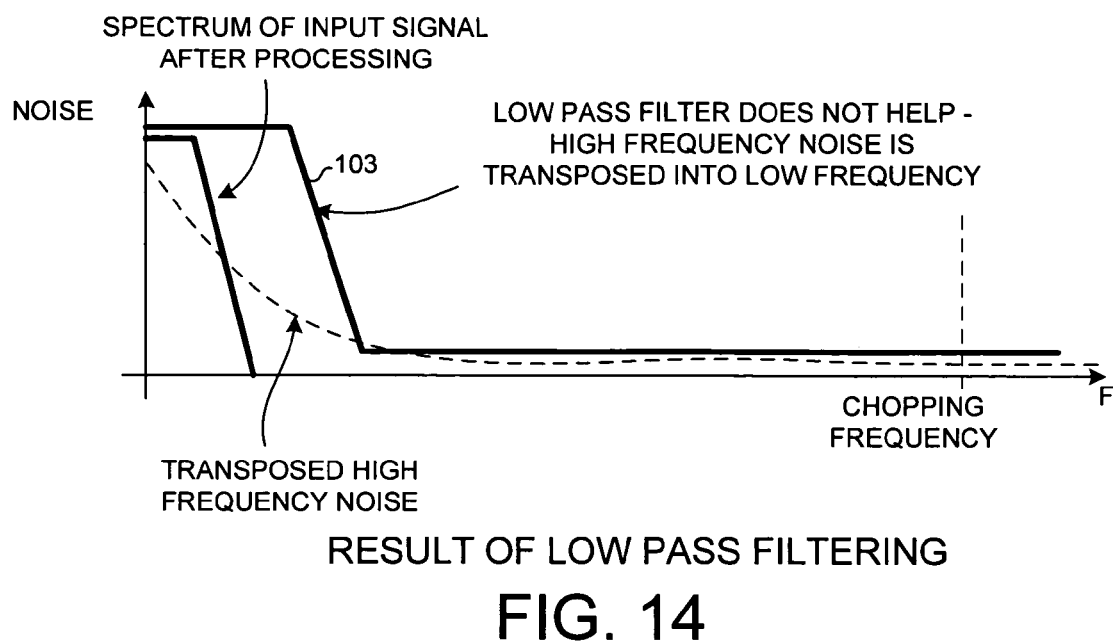

FIG. 14 illustrates the result of filtering the result of inverting. The frequency response of the low pass filter is represented by line 103. Although the low pass filter removes the 1/F drift component of the total noise as desired, the high frequency noise component of the total noise is in the pass band of the low pass filter. The high frequency noise therefore passes through the system and can obscure the sensor signal to be detected. The magnitude of the noise can be higher than the magnitude of each voltage step that is to be detected as a different digital value.

Figure 15:
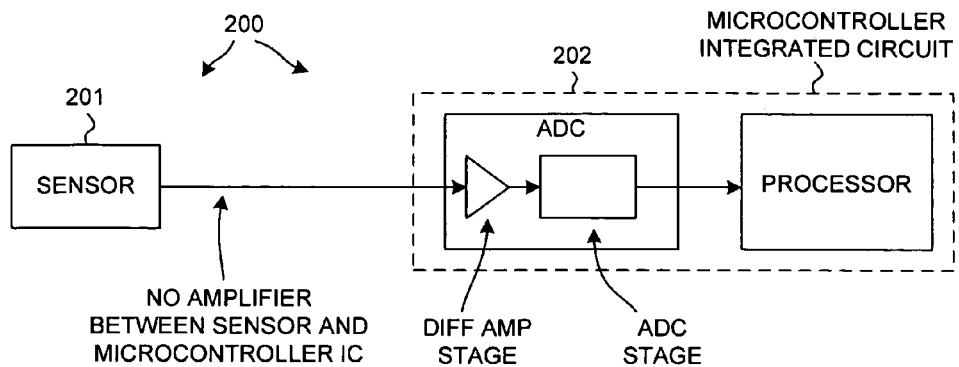
FIG. 15 is a block diagram of a system in accordance with one novel aspect.

FIG. 15 is a block diagram of a system 200 in accordance with one novel aspect. System 200 includes a sensor 201 that is directly coupled to a microcontroller integrated circuit 202. In one embodiment, there is no intervening amplifier and there is no intervening chopping amplifier in the signal path of the analog signal between sensor 201 and microcontroller integrated circuit 202.

Figure 16:
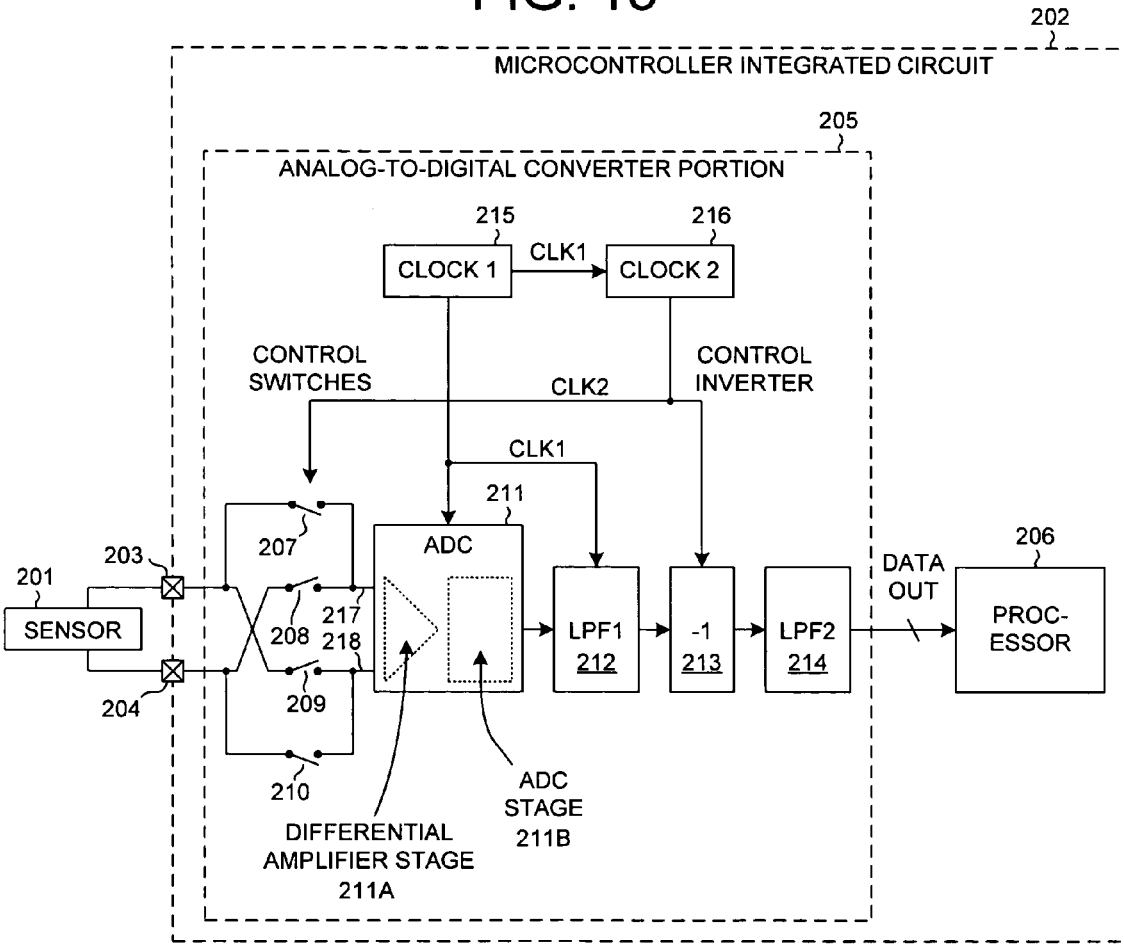
FIG. 16 is a more detailed diagram of the system of FIG. 15.

FIG. 16 is a more detailed diagram of system 200. Microcontroller integrated circuit 202 includes a pair of input terminals 203-204, an analog-to-digital converter (ADC) portion 205, and a processor portion 206. In some embodiments, one of the input terminals is a ground terminal. Processor portion 206 is, for example, an eight-bit processor of the Z8 architecture available from Zilog Inc. of San Jose, Calif. Processor portion 206 is interfaced to ADC portion 205 in standard fashion through registers and/or interrupts.

Analog-to-digital converter portion 205 is a chopping ADC that employs oversampling. ADC portion 205 includes a set of four switches 207-210, a sigma-delta analog-to-digital converter (sigma delta ADC) 211, a first low-pass filter 212, an inverter 213, a second low-pass filter 214, a source 215 of a first clock signal CLK1, and a source 216 of a second clock signal CLK2. Sigma delta ADC 211 includes a differential amplifier input stage 211A as well as a sigma delta modulator stage 211B. Sigma delta ADC 211 is a low power sigma delta ADC of conventional construction.

CLK2 is of a lower frequency that CLK1. Source 216 may, for example, be a counter that divides CLK1 by an integer to obtain CLK2 of the lower frequency. Alternatively, a phase-locked loop (PLL) may be provided to generate both CLK1 and CLK2. The set of four switches 207-210 may, for example, be of the same type and construction that are used to do the chopping in discrete chopping amplifiers. In this example, switches 207-210 are pass gates where each pass gate is made up of a P-channel field effect transistor and an N-channel field effect transistor.

In one example of system 200, sensor 201 is a motion detector that has a 1.5 volt common mode output voltage. The motion detector outputs a voltage that ranges over a small three millivolt range, centered at the 1.5 common mode voltage. When no motion is being sensed by the motion sensor, the signal output by the motion sensor is considered to be a DC signal of 1.5 volts. System 200 detects sensor voltages over the three millivolt range in 128 steps. ADC portion 205 receives an input signal that ranges over the three millivolt range and, for each of the 128 steps, the ADC portion 205 outputs a different 16-bit digital value (DATA OUT) to processor portion 206. Because system 200 has a low frequency signal-to-noise ratio that is higher than one hundred, system 200 outputs a different 16-bit digital value for each 23 microvolt step in the sensor output signal even when ADC portion 205 is integrated in a straightforward simple way onto the same integrated circuit with processor portion 206.

The second clock signal CLK2 controls switches 207-210 such that when CLK2 is low, first input terminal 203 is coupled to ADC input lead 217 and such that second input terminal 204 is coupled to ADC input lead 218. When CLK2 is low, first input terminal 203 is coupled to ADC input lead 218, and second input terminal 204 is coupled to ADC input lead 217.

In operation, the level of CLK2 is initially a digital low. Switches 207-210 are configured so that first input terminal 203 is coupled to ADC input lead 217 and so that second input terminal 204 is coupled to ADC input lead 218. The voltage signal output by sensor 201 is therefore supplied in non-inverted form to the input leads of ADC 211. While CLK2 is low, ADC 211 performs a plurality of ADC conversions (for example, sixty-four conversions), and outputs a corresponding sequence of 16-bit digital values corresponding to the detected magnitude of the sensor output signal. One conversion is performed on each rising edge of the first clock signal CLK1. These digital values are converted into a single 16-bit value by first low pass filter 212. First low-pass filter 212 may, for example, be a digital filter implemented entirely in hardware. First low-pass filter 212 may be implemented in software, or a combination of hardware and software.

Inverter 213 is controlled by second clock CLK2. If second clock CLK2 is low, then inverter 213 does not invert and the 16-bit value output by first low-pass filter 212 is supplied to the input of second low-pass filter 214. If second clock CLK2 is high, then inverter 213 inverts and the 16-bit value output by first low-pass filter 212 is supplied in inverted form to the input of second low-pass filter 214. Because CLK2 is low, inverter 213 supplies the 16-bit value output from first low-pass filter 212 to second low-pass filter 214 without inversion.

Next, CLK2 transitions high. Switches 207-210 are reconfigured (i.e., are "flipped") so that first terminal 203 is coupled to ADC input lead 218 and so that second terminal 204 is coupled to ADC input lead 217. This flipping of the input switches is referred to here as "chopping". The analog voltage signal output by sensor 201 is therefore supplied in inverted form to the input leads 217 and 218 of ADC 211. While CLK2 is high, ADC 211 performs a second plurality of ADC conversions (for example, sixty-four conversions), and outputs a corresponding sequence of 16-bit digital values corresponding to the detected magnitude of the sensor output signal. One conversion is performed on each rising edge of the first clock signal CLK1. First low pass filter 212 converts these digital values into a single 16-bit value. Because CLK2 is high, inverter 213 performs inversion and supplies the 16-bit value output from first low-pass filter 212 to second low-pass filter 214 in inverted form. The inverting of values by inverter 213 (when switches 207-210 are reconfigured to couple input terminal 204 to input lead 217 and to couple input terminal 203 to input lead 218) is referred to here as "inverting".

Second low-pass filter 214 performs filtering on the outputs of inverter 213, thereby outputting a sequence of 16-bit ADC portion output values. Second low-pass filter 214 can be any suitable width down to a width of two.

Figure 17:
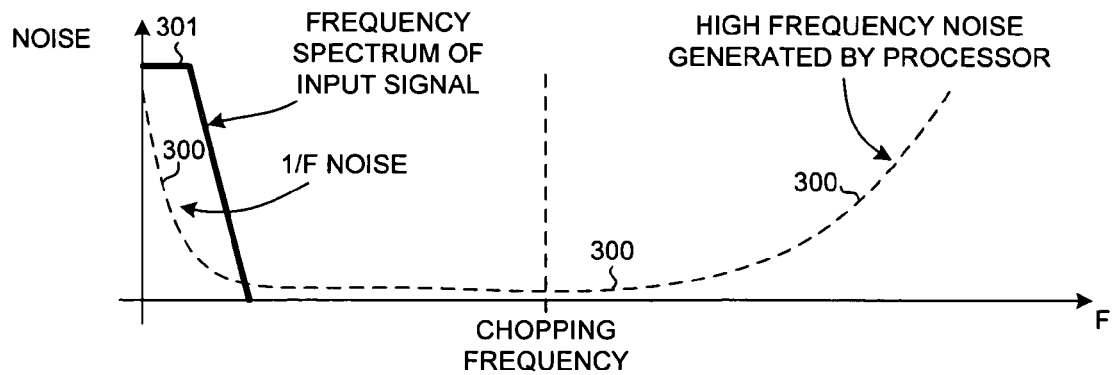
FIGS. 17-22 illustrate an operation of the system of FIGS. 15 and 16.

FIGS. 17-22 illustrate various stages in the operation of system 200. The dashed line 300 in FIG. 17 represents the total noise in the system. The total noise includes a low frequency component due to 1/F noise. The total noise also includes a high frequency component that is generated by processor portion 206 or other high speed digital circuitry on integrated circuit 202. The spectrum of the low frequency sensor voltage signal to be detected is represented by line 301. The vertical dashed line represents the chopping frequency. Note that the chopping frequency is placed in the low noise band of the total noise line 300, well below the frequency band where the high frequency noise is present.

Figure 18:
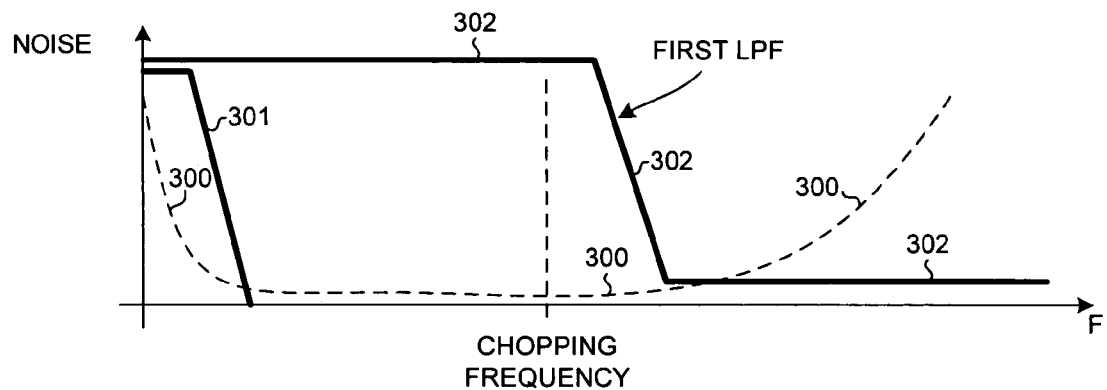

FIG. 18 shows the frequency response 302 of the first low-pass filter 212. First low-pass filter 212 is designed to pass signals of the chopping frequency but to block signals at the high frequencies of the high frequency component of the total noise line 300. Where the first low-pass filter 212 is a digital filter realized in hardware, the coefficients of the filter can be programmable by software (software executed by processor portion 206). The frequency response of the first low-pass filter can be changed and the cutoff frequency of the first low-pass filter can be adjusted under software control to optimize performance in a given application.

Figure 19:
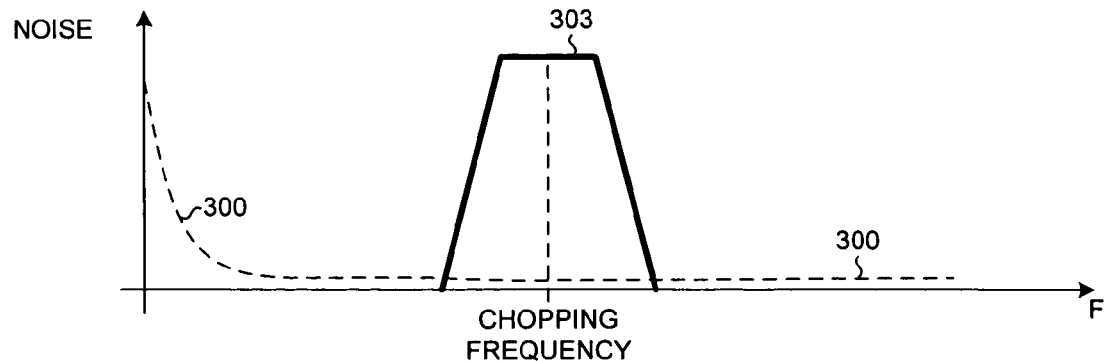

FIG. 19 illustrates the result of chopping and filtering by the first low-pass filter. Chopping has transposed the low-frequency sensor output signal to be centered at a multiple (for example, a 1× multiple) of the chopping frequency. Line 303 represents the spectrum of the transposed sensor signal. The first low-pass filter has attenuated or eliminated the high frequency noise component of total noise line 300. The number of ADC samples taken between each successive switch of switches 207-210 can be programmable by software (by software executing on processor portion 206). The chopping frequency (CLK2 frequency) can also be programmable under software control such that both CLK2 and CLK1 can be independently adjusted under software control to optimize performance in a given application.

Figure 20:
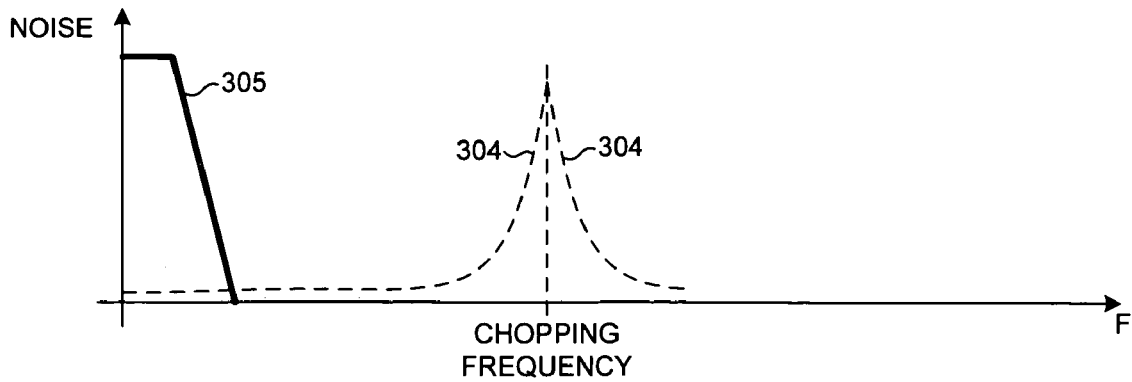

FIG. 20 illustrates the result of the "inverting" process. The low-frequency 1/F noise is transposed by the inverting process so that the first harmonic of 1/F noise is centered at the chopping frequency as illustrated. Line 304 represents the transposed 1/F noise. Line 305 represents the spectrum of the input signal. Note that the spectrum of the input signal has been transposed back down to low frequency.

Figure 21:
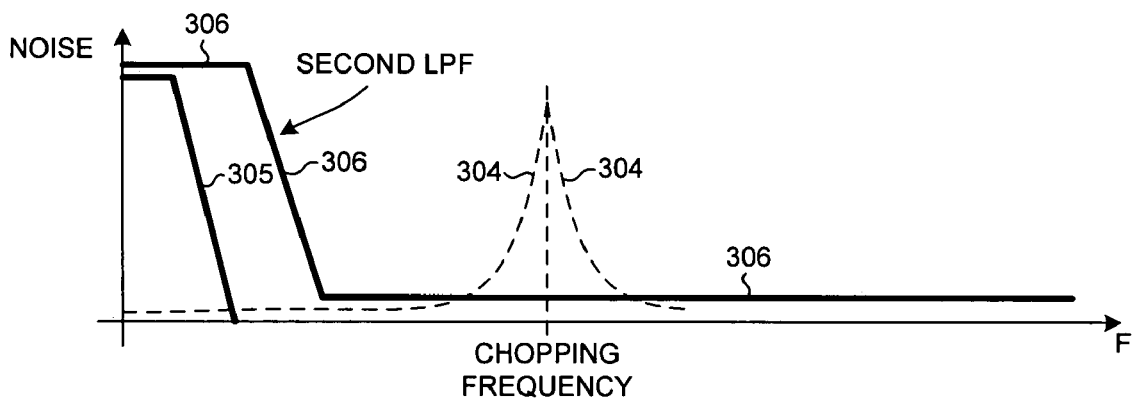

FIG. 21 illustrates the second low-pass filtering step. The frequency response of the second low-pass filter 214 is represented by line 306. Note that the cutoff frequency of second low-pass filter 214 is below the chopping frequency.

Figure 22:
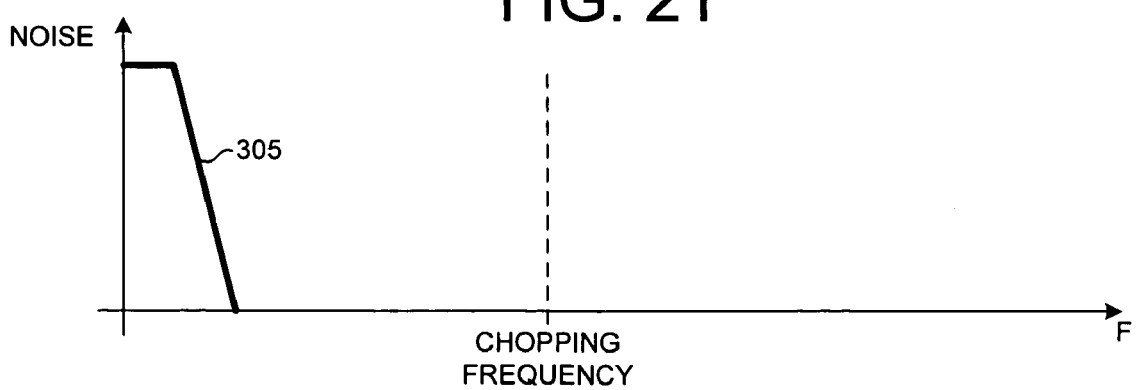

FIG. 22 illustrates the result of performing the second low-pass filtering step. The 1/F noise 304 that was transposed by inversion to the chopping frequency is attenuated or eliminated by the second low-pass filter 214.

Figure 1:
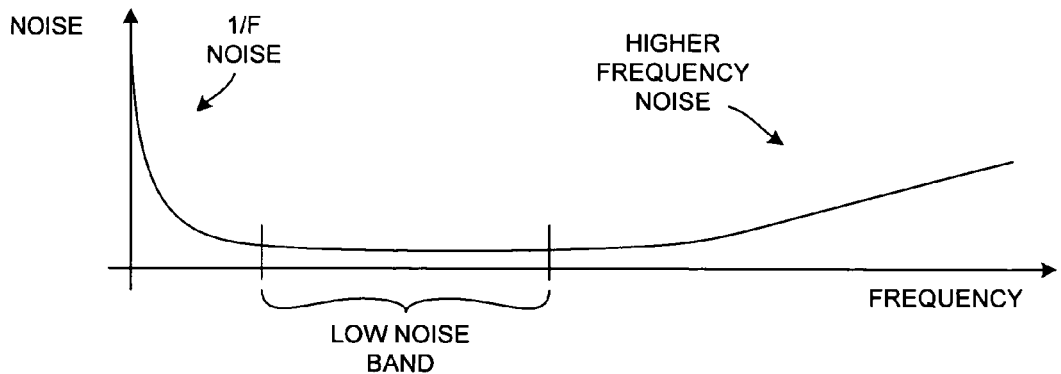
FIG. 1 (Prior Art) is a simplified diagram of noise in an analog system.
Figure 2:
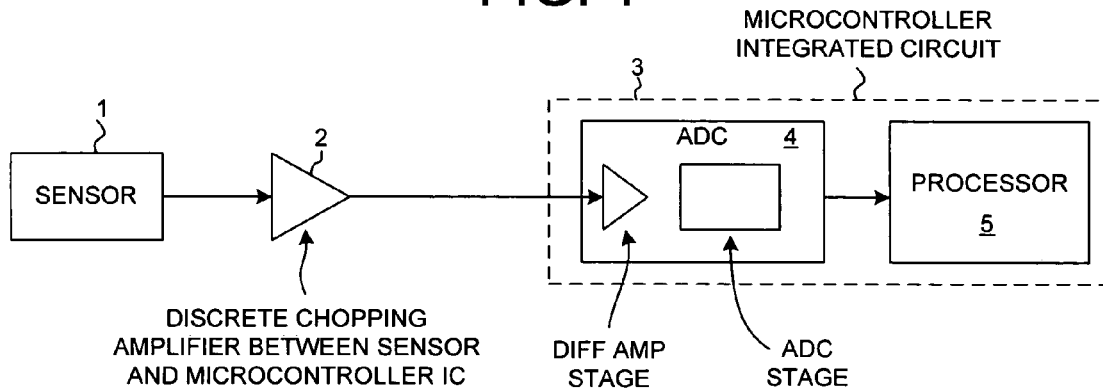
FIG. 2 (Prior Art) is a block diagram of a conventional analog-to-digital converter system employing chopping.
Figure 3:
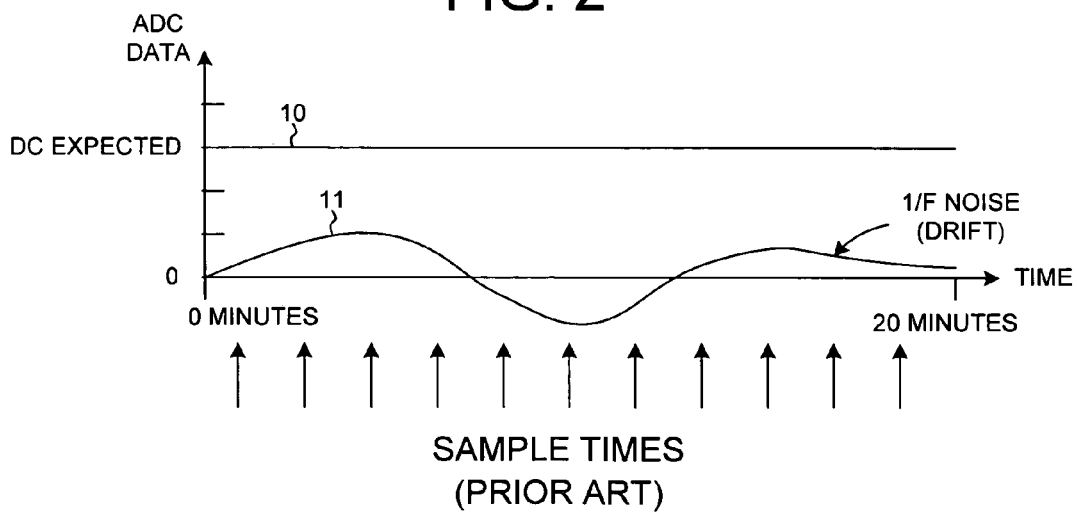
FIGS. 3-6 (Prior Art) illustrate conventional chopping in the time domain.
Figure 4:
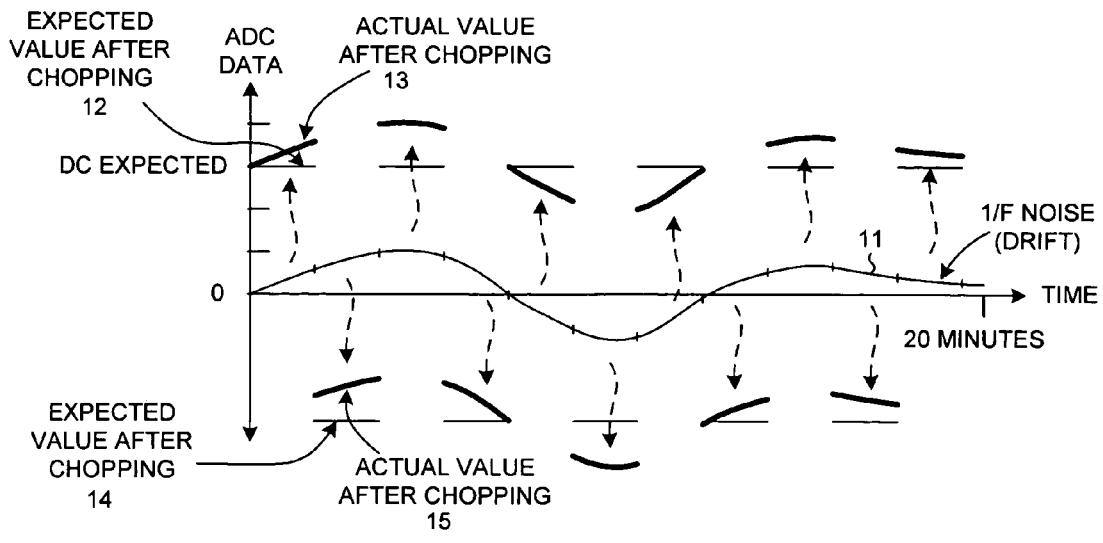
Figure 5:
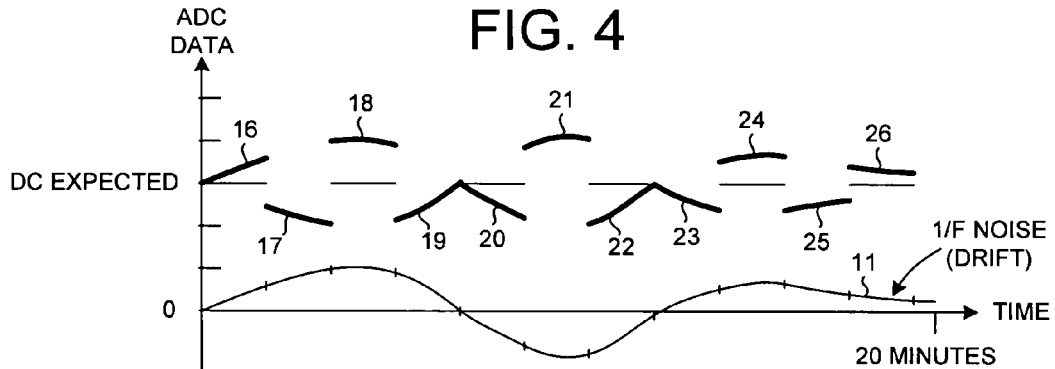
Figure 6:
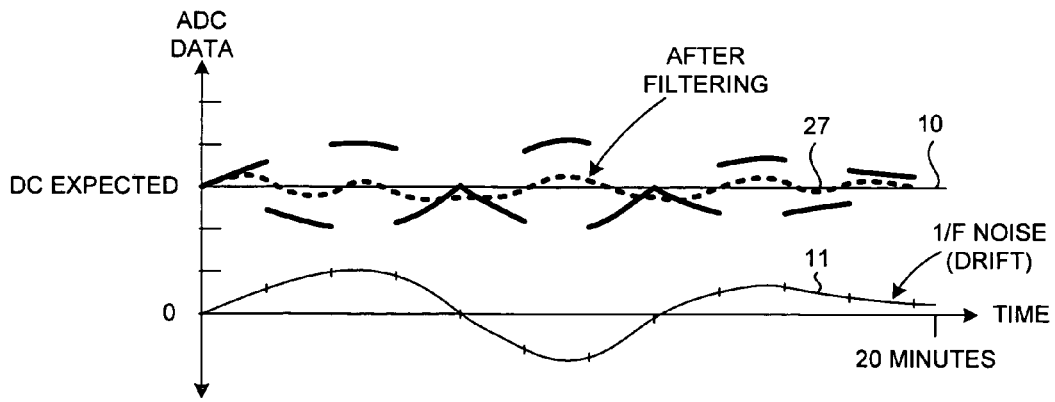
Figure 7:
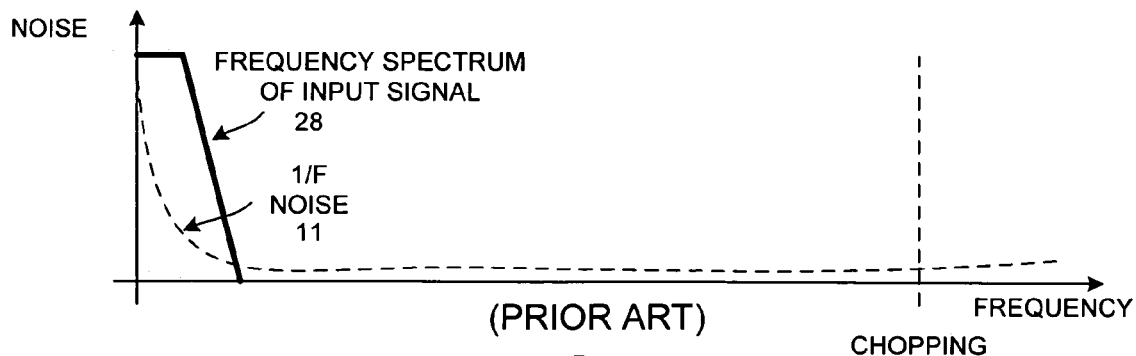
FIGS. 7-10 (Prior Art) illustrate conventional chopping in the frequency domain.
Figure 8:
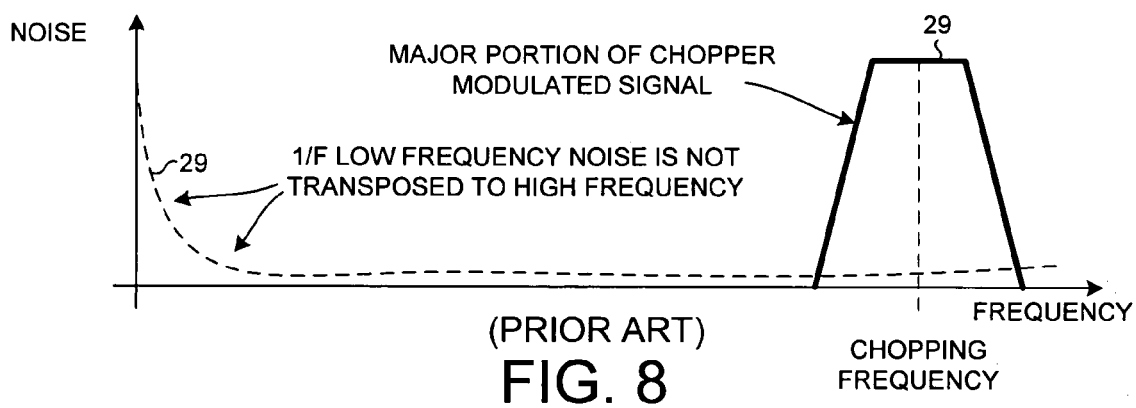
Figure 9:
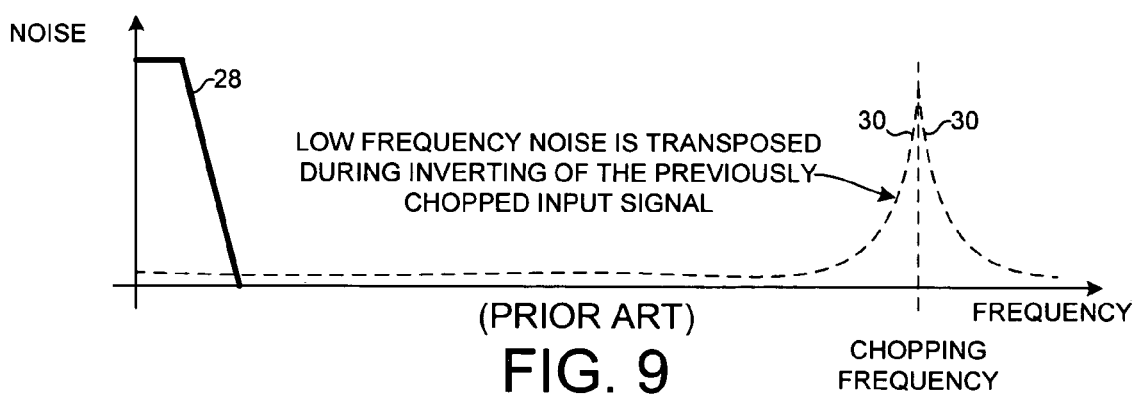
Figure 10:
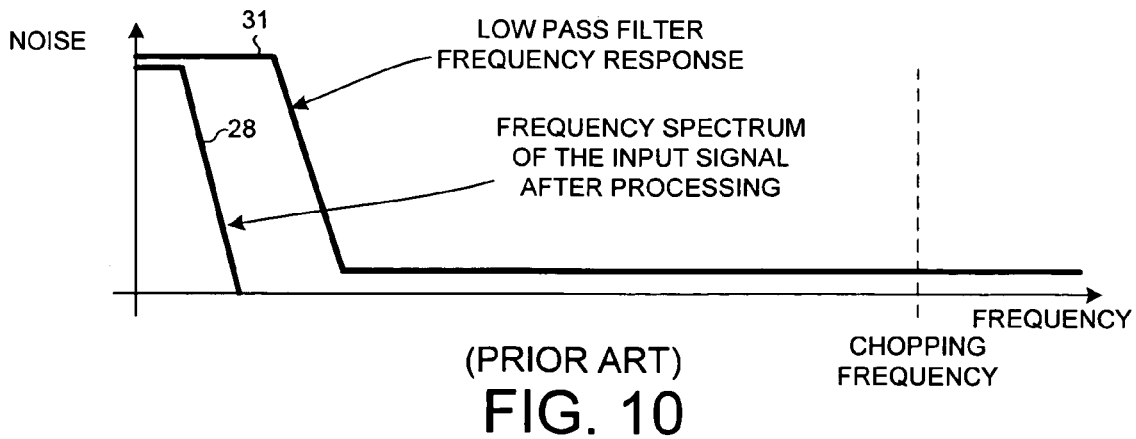

In the prior art system of FIG. 2, after the flipping of the switches inside the chopping amplifier 2, there is a period of time before the output of chopping amplifier 2 reaches the value it should be. ADC 4 can only start to convert once the output of chopping amplifier 2 is settled. There is one such wait state that precedes each conversion because in the prior art system of FIG. 2 there is one conversion for each flipping of the switches. Accordingly, the limit on the speed at which the chopping amplifier 2 can output a settled signal puts a limit on the rate of conversions. A commercially available discrete standalone chopping amplifier 2 may be designed to have a high slew rate so that it can switch rapidly and so that it can support a high chopping frequency. To achieve this high slew rate, however, the amplifier must draw a lot of current. In a low current application where the ADC system is battery powered, the current draw of such a commercially available chopping amplifier 2 may cause the chopping amplifier 2 to burn more power than the entire power budget allotted to the ADC system.

In the novel system of FIGS. 15 and 16, on the other hand, the ADC 211 is a sigma delta ADC. By its nature, a sigma delta ADC generally consumes a small amount of power and has a relatively long settling time on the order of 100 microseconds. Due to long conversion time characteristic of sigma delta ADC stage 211B, the effect of the initial unsettled output from the prior differential amplifier stage 211A is spread over the entire conversion time of the sigma delta ADC stage and is therefore minimized. Moreover, in the novel system of FIGS. 15 and 16, multiple conversions are performed between each flipping of switches 207-210. Differential amplifier stage 211A can therefore be a low power amplifier with a low maximum slew rate and a long settling time. Only the first conversion after the flipping of switches 207-210 will be adversely affected by the unsettled output of the differential amplifier stage 211A. First low-pass filter 212 filters over multiple conversions of ADC 211, so the effects of the first inaccurate conversion on the output of the first low-pass filter 212 are minimized.

In another embodiment, ADC 211 is not a low power sigma delta ADC, but rather is a higher power ADC converter that is capable of performing faster conversions. Some of the initial conversions after the flipping of switches 207-210 may be inaccurate due to the output of differential stage 211A being unsettled, but the later averaging of the conversions by first low-pass filter 212 minimizes the effect of these initial incorrect conversions on the output of the first low-pass filter. In another embodiment, the first low-pass filter 212 is a filter that ignores a predetermined number of initial conversions after the flipping of switches 207-210. The first low-pass filter 212 only filters subsequent conversion values that follow the initial conversion values. ADC system 200 outputs a different 16-bit digital value for each 23 microvolt step in the signal output from sensor 201 even when ADC portion 205 is integrated in a straightforward simple way onto the same integrated circuit with processor portion 206. The signal-to-noise ratio of ADC system 200 is greater than 100 at DC (zero Hertz) when microcontroller integrated circuit 202 is receiving and converting the low frequency analog signal output from sensor 201 into 16-bit values.

Although the present invention has been described in connection with certain specific embodiments for instructional purposes, the present invention is not limited thereto. Although the first and second low-pass filters in the embodiment described above are low-pass digital filters that have down-sampled outputs, in other embodiments the first and/or second low-pass filters are low-pass digital filters whose outputs are not down-sampled. The chopping and oversampling techniques described above are usable to reduce low frequency drift due to 1/F noise in a CMOS integrated ADC system without resorting to special shielding techniques and exotic silicon-germanium processing. In one example, if the two input terminals via which the analog sensor signal is received onto the CMOS integrated circuit are shorted together, then the magnitude of ADC output values generated is seen to drift over a twenty minute time period by an amount that is less than the magnitude that the ADC output values would change if a 0.5 millivolt amplitude input signal were present across the two input terminals. The CMOS system has a signal-to-noise ratio of more than one hundred (at approximately zero Herz) when converting the analog input signal from the analog sensor into the ADC output values. The chopping frequency, the cutoff frequency of the first low-pass filter, the cutoff frequency of the second low-pass filter, and the number of analog-to-digital conversions performed per chopping clock cycle are controllable by software executing on the processor of a microcontroller integrated circuit. In some embodiments, the first low-pass filter, the inverter, and the second low-pass filter are implemented entirely in software executing on the processor of the microcontroller. Accordingly, various modifications, adaptations, and combinations of various features of the described embodiments can be practiced without departing from the scope of the invention as set forth in the claims.

What is claimed is:

1. A method of receiving an analog input signal and generating therefrom an analog-to-digital converter output value (ADC output value), the method comprising:
   (a) setting a plurality of chopping switches in a first configuration such that the analog input signal is supplied to an analog-to-digital converter in a first polarity;
   (b) converting the analog input signal of the first polarity into a first plurality of digital values;
   (c) supplying the first plurality of digital values to a first low-pass filter such that the first low-pass filter generates therefrom first low-pass filtered information;
   (d) setting the plurality of chopping switches in a second configuration such that the analog input signal is supplied to the analog-to-digital converter in a second polarity opposite the first polarity;
   (e) converting the analog input signal of the second polarity into a second plurality of digital values;
   (f) supplying the second plurality of digital values to the first low-pass filter such that the first low-pass filter generates therefrom second low-pass filtered information;
   (g) inverting the second low-pass filtered digital value to generate inverted second low-pass filtered information; and
   (h) supplying the first low-pass filtered information and the inverted second low-pass filtered information to a second low-pass filter, the second low-pass filter generating therefrom the ADC output value.

2. The method of claim 1, wherein the inverting of (g) is performed by an inverter circuit, the inverter circuit receiving the first low-pass filtered information and outputting the first low-pass filtered information to the second low-pass filter in non-inverted form, the inverter circuit also receiving the second low-pass filtered information and outputting the inverted second low-pass filtered information to the second low-pass filter.

3. The method of claim 2, wherein the first low-pass filter is a filter taken from the group consisting of: a low-pass filter having a down-sampled output, and a low-pass filter whose output is not down-sampled; and wherein the second low-pass filter is a filter taken from the group consisting of: a low-pass filter having a down-sampled output, and a low-pass filter whose output is not down-sampled.

4. The method of claim 1, wherein the first plurality of digital values in (b) is a number of digital values that is programmable, and wherein the second plurality of digital values in (e) is a number of digital values that is programmable.

5. The method of claim 1, wherein the plurality of chopping switches is repeatedly set in the first configuration and then in the second configuration at a chopping frequency, wherein the first low-pass filter has a cutoff frequency that is greater than the chopping frequency, and wherein the second low-pass filter has a cutoff frequency that is lower than the chopping frequency.

6. The method of claim 1, wherein the converting of (b) and the converting of (e) are performed by a sigma delta analog-to-digital converter.

7. The method of claim 1, further comprising:
   (i) supplying the ADC output value to a processor portion of an integrated circuit, wherein the processor portion executes instructions, and wherein the plurality of chopping switches is disposed on the integrated circuit.

8. The method of claim 1, wherein steps (a) through (g) are performed by an analog-to-digital converter portion (ADC portion) of a microcontroller integrated circuit, wherein a digital processor is disposed on the microcontroller integrated circuit, the digital processor executing instructions, wherein the analog input signal is output from a sensor and is supplied to the ADC portion of the microcontroller integrated circuit, wherein the sensor and the microcontroller integrated circuit together comprises a system, the system having a signal-to-noise ratio (at approximately zero Hertz) of more than one hundred when converting the analog input signal into the ADC output signal.

9. An integrated circuit comprising:
   a digital processor portion that receives an analog-to-digital converter output value (ADC output value), wherein the digital processor portion fetches and executes instructions; and
   an analog-to-digital converter portion that receives an analog input signal from a pair of input terminals of the integrated circuit, the analog-to-digital converter portion generating the ADC output value, the analog-to-digital converter portion comprising:
      a chopping switch circuit that is coupled to the pair of input terminals;
      an analog-to-digital converter (ADC), the ADC having a pair of input leads that are coupled to the chopping switch circuit, the ADC outputting a first plurality of conversion values when the chopping switch circuit is configured in a first configuration, the ADC outputting a second plurality of conversion values when the chopping switch circuit is configured in a second configuration;
      a first low-pass filter/inverter that receives the first plurality of conversion values and generates therefrom first low-pass filtered information, the first low-pass filter/inverter receiving the second plurality of conversion values and generating therefrom second low-pass filtered information; and
      a second low-pass filter that receives the first low-pass filtered information and the second low-pass filtered information and generates therefrom the ADC output value.

10. The integrated circuit of claim 9, wherein the first low-pass filter/inverter inverts each of the second plurality of conversion values and then low-pass filters the inverted conversion values to generate the second low-pass filtered information.

11. The integrated circuit of claim 9, wherein the first low-pass filter/inverter low-pass filters the second plurality of conversion values to generate second information and then inverts the second information to generate the second low-pass filtered information.

12. The integrated circuit of claim 9, wherein the chopping switch circuit performs chopping at a chopping frequency, wherein the second low-pass filter has a cutoff frequency that is lower than the chopping frequency, wherein the first low-pass filter/inverter includes a low-pass filter, wherein the low-pass filter of the first low-pass filter/inverter has a cutoff frequency that is higher than the chopping frequency.

13. The integrated circuit of claim 9, wherein the ADC is a sigma delta ADC.

14. The integrated circuit of claim 9, wherein the first plurality of conversion values is a number of conversion values that is programmable by the digital processor portion, and wherein the second plurality of conversion values is a number of conversion values that is programmable by the digital processor.

15. The integrated circuit of claim 9, wherein one of the pair of input terminals is a ground terminal.

16. The integrated circuit of claim 9, wherein the first low-pass filter/inverter includes a low-pass filter and an inverter, wherein the low-pass filter is a filter taken from the group consisting of: a low-pass filter having a down-sampled output, and a low-pass filter whose output is not down-sampled; and wherein the second low-pass filter is a low-pass filter taken from the group consisting of: a low-pass filter having a down-sampled output, and a low-pass filter whose output is not down-sampled.

17. A system, comprising:
   a sensor that outputs an analog signal; and
   an integrated circuit comprising:
      means for receiving the analog signal directly from the sensor such that there is no amplifier outside the integrated circuit that is in a signal path of the analog signal between the sensor and the means for receiving, wherein the means is also for chopping the analog signal at a chopping frequency to generate a chopped analog signal, the chopping frequency being substantially lower than a rate at which the means performs analog-to-digital conversions on the chopped analog signal, the means also being for outputting an analog-to-digital converter output value (ADC output value) that is a digital representation of a magnitude of the analog signal; and
      a digital processor portion that receives the ADC output value from the means, wherein the digital processor portion fetches and executes instructions, wherein the integrated circuit does not include germanium, wherein the analog signal is received onto the integrated circuit from the sensor via two terminals, wherein if the two terminals are shorted together then the means generates a stream of ADC output values over a time period of twenty minutes, wherein a magnitude of the ADC output values drift over the time period of twenty minutes by an amount that is less than a magnitude that the ADC output values would change if a 0.5 millivolt amplitude input signal were present across the two terminals.

18. The system of claim 17, wherein the integrated circuit is a microcontroller integrated circuit.

19. The system of claim 18, wherein the chopping frequency is X, and wherein the rate at which the means performs analog-to-digital conversions is Y, and wherein Y is at least ten times greater than X.

* * * * *